United States Patent
Lin

(10) Patent No.: US 11,809,212 B2
(45) Date of Patent: Nov. 7, 2023

(54) EXPANDING CARRIER TRAY FOR ADDITIONS TO COMPUTER, STORAGE MODULE, AND COMPUTER

(71) Applicant: Fulian Precision Electronics (Tianjin) Co., LTD., Tianjin (CN)

(72) Inventor: Ke-Cheng Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 15 days.

(21) Appl. No.: 17/720,452

(22) Filed: Apr. 14, 2022

(65) Prior Publication Data

US 2022/0334622 A1   Oct. 20, 2022

(30) Foreign Application Priority Data

Apr. 14, 2021 (CN) .......................... 202110400203.X

(51) Int. Cl.
*G06F 1/18* (2006.01)
*H05K 7/18* (2006.01)

(52) U.S. Cl.
CPC ............. *G06F 1/183* (2013.01); *H05K 7/183* (2013.01)

(58) Field of Classification Search
CPC ....................................................... H05K 1/18
See application file for complete search history.

(56) References Cited

U.S. PATENT DOCUMENTS

| 8,218,315 B2 * | 7/2012 | Lu ........................... G06F 1/187 |
| | | 312/319.1 |
| 9,374,924 B2 * | 6/2016 | Boretti ................ H05K 7/1401 |
| 2007/0159786 A1 | 7/2007 | Liu et al. |

FOREIGN PATENT DOCUMENTS

TW           M308438 U        3/2007

* cited by examiner

*Primary Examiner* — Jerry Wu
(74) *Attorney, Agent, or Firm* — ScienBiziP, P.C.

(57) ABSTRACT

A carrier tray to allow rapid installment of additional modules or devices, without screws, into a computer includes a frame, two sliders, an elastic member, and a handle. A bracket of the frame has a unit cavity. The two sliders can slide along a first direction and the elastic member is compressible between the two sliders. The handle allows pushing and pulling of the tray along a second direction and is attached to the two sliders, the two sliders can move towards each other (to a first position) or apart (to a second position). The two sliders return to the unity cavity by pulling the handle from the first position to the second position along the second direction. Continued pulling of the handle in the second direction removes the carrier tray from the computer.

19 Claims, 5 Drawing Sheets

EXPANDING CARRIER TRAY FOR ADDITIONS TO COMPUTER, STORAGE MODULE, AND COMPUTER

FIELD

The subject matter herein generally relates to computer construction.

BACKGROUND

In the computer, additional function modules or devices can be installed to expand the functions of the computer. The modules or devices are generally installed by screws, which is inconvenient.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
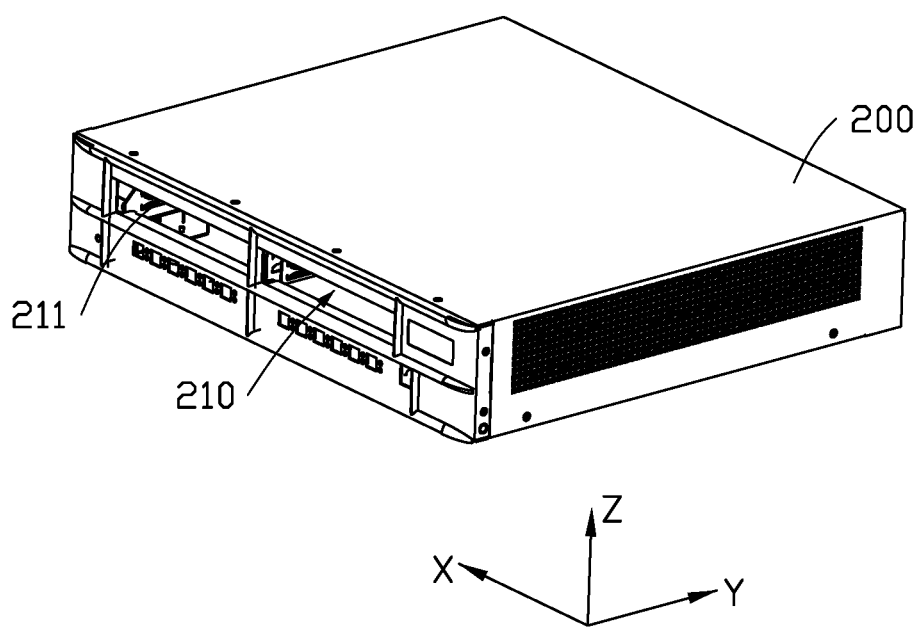
FIG. 1 is a schematic diagram of a computer according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
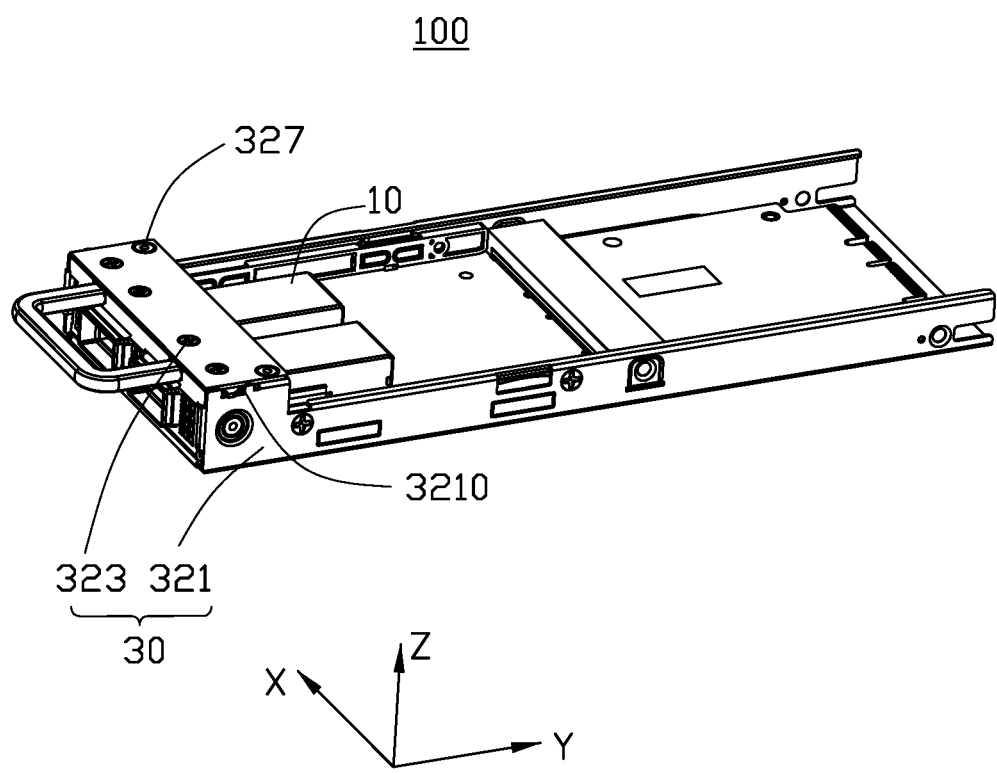
FIG. 2 is a schematic diagram of a storage module according to an embodiment of the present disclosure.

As shown in FIG. 1 and FIG. 2, a computer 1000 of an embodiment includes a rack 200, a mainboard, and a plurality of storage modules 100. A plurality of assembling cavities 210 is defined in the rack 200. One of the storage modules 100 is mounted in one of the assembling cavities 210. When the storage module 100 is mounted in an assembling cavity 210, the storage module 100 is fixed with the rack 200.

Figure 3:
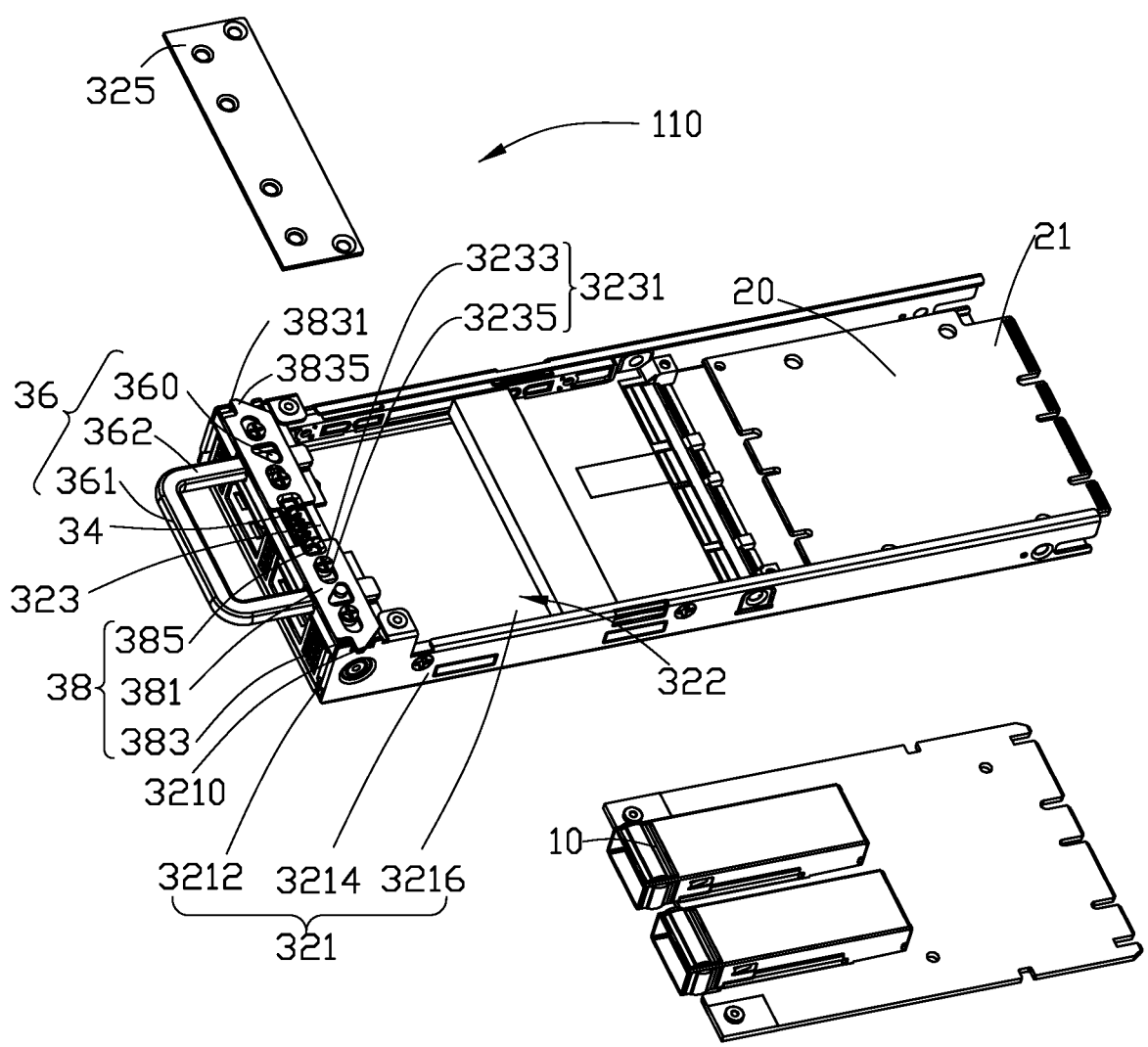
FIG. 3 is an exploded diagram of a storage module according to an embodiment of the present disclosure.
Figure 4:
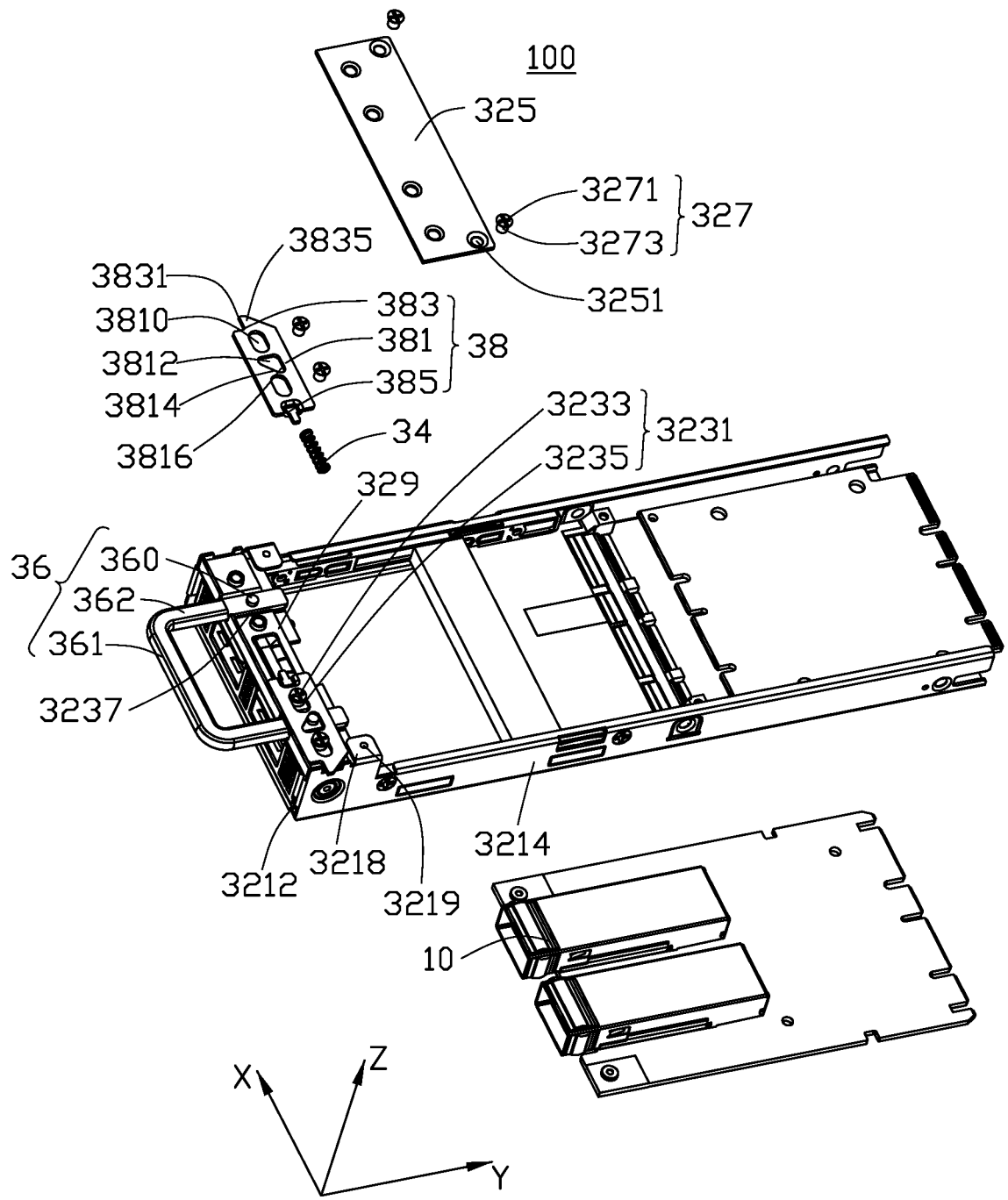
FIG. 4 is another exploded diagram of a storage module according to an embodiment of the present disclosure.

As shown in FIG. 3 and FIG. 4, the storage module 100 includes a carrier tray, a storage unit 10, and an adapter 20. The carrier tray includes a frame 30 and a locking assembly.

The frame 30 includes a bracket 32. The bracket 32 includes a first plate 3212 and two second plates 3214. The two second plates 3214 are on opposite sides of the first plate 3212 along a first direction X.

The frame 30 further includes a third plate 3216. The third plate 3216 is located between the two second plates 3214 and connected to the two second plates 3214 and the first plate 3212. A unit cavity 322 is defined by the first plate 3212, the third plate 3216, and the two second plates 3214. The storage unit 10 is arranged in the unit cavity 322 and connected to the first plate 3212. The adapter 20 is arranged in the unit cavity 322, and connected to the third plate 3216. One end of the adapter 20 is coupled to the storage unit 10, the other end of the adapter 20 forms a connection part 21. The connection part 21 is configured to be coupled to the mainboard.

The frame 30 further includes a mounting assembly 323. The mounting assembly 323 includes a first base 329 and a second base 325. The second base 325 is arranged on one side of the first base 329 away from the third plate 3216. A mounting cavity is formed between the first base 329 and the second base 325.

The bracket 32 includes a flange 3218, and the flange 3218 is coupled to the second plate 3214 away from the side of the third board along a third direction Z. The third direction Z is perpendicular to the first direction X. A part of the flange 3218 extends into the mounting cavity, and a first hole 3219 is defined in part of the flange 3218.

The frame 30 further includes two mounting fastener 327s. The mounting fastener 327 includes a mounting head 3271 and a mounting shank 3273, the mounting head 3271 is fixedly coupled to the mounting shank 3273. The mounting shank 3273 is configured to pass through the second hole 3151 and the first hole 3219 and be screwed on the first base 329. The mounting head 3271 restricts the position of the second base 325 and the first base 329 in the third direction Z.

The locking assembly is mounted in the mounting cavity. The locking assembly includes a handle 36 and two sliders 38. The two sliders 38 correspond to the two second plates 3214. The two sliders 38 are slidably mounted on the first base 329. The locking assembly further includes four guiding fasteners 3231. The guiding fastener 3231 includes a guiding head 3233 and a guiding shank 3235. Two of the four fasteners correspond to one slider 38, the other two fasteners correspond to the other slider 38. Two first guiding holes 3810 are defined on the slider 38, and the guiding shank 3235 passes through the first guiding hole 3810 and is screwed on the first base 329. The first guiding hole 3810 is defined along the first direction X. Inner wall of the first guiding hole 3810 is in contact with the guiding shank 3235, the first guiding hole 3810 can guide the guiding fastener 3231 to slide relative to the slider 38 along the first direction X.

In another embodiment, the number of first guiding holes 3810 on each slider 38 can be only one. A block which is substantially rectangular is mounted outside the guiding fastener 3231, and opposite sides of the block are in contact with the inner wall of the first guiding hole 3810.

The handle 36 includes a moving part 361 and two sliding parts 362. The moving part 361 is between and coupled to the two sliding parts 362. The moving part 361 is not within the unit cavity 322. The sliding part 362 is slidably mounted on the first base 329, and extends out of the mounting cavity. The handle 36 can slide relative to the first base 329 along the second direction Y, the second direction Y is perpendicular to the first direction X and to the third direction Z. Each sliding part 362 is provided with a bulge part 360. The handle 36 is provided with two bulge parts 360. A second guiding hole 3812 is defined on the slider 38. The bulge part 360 extends into the second guiding hole 3812. A first guiding wall 3814 is defined on the slider 38, and a part of the inner wall of the second guiding hole 3812 forms the first guiding wall 3814. The first guiding wall 3814 is inclined in the first direction X and the second direction Y. When the handle 36 is moved along the second direction Y with respect to the first base 329, the bulge part 360 is in contact with the first guiding wall 3814, and the first guiding wall 3814 guides movement of the slider 38 along the first direction X with respect to the first base 329.

The locking assembly further includes an elastic member 34. The elastic member 34 is between the two sliders 38. The elastic member 34 can apply an elastic pressing force to the two sliders 38, so that the two sliders 38 can slide away from each other along the first direction X. The slider 38 includes main part 381 and mounting part 385. The mounting part 385 is arranged on a side of the main part 381 of the slider 38 close to the other slider 38. In an embodiment, the elastic member 34 can be a compression spring. One end of member 34 is sleeved on one mounting part 385, and the other end is sleeved on the other mounting part 385. The mounting part 385 limits the position of the member 34 along the third direction Z and the second direction Y. When the two sliders 38 come towards each other, the spring is compressed. The compressed spring urges the two sliders 38 away from each other.

The second guiding hole 3812 is a hole, triangular in shape. A second guiding wall 3816 is defined on the slider 38, and a part of an inner wall of the second guiding hole 3812 forms the second guiding wall 3816. The second guiding wall 3816 is parallel to the first direction X. When the two sliders 38 move towards each other, the guiding fastener 3231 is in contact with the second guiding wall 3816, and the two sliders 38 can move parallel to the first direction X. As the two sliders 38 move towards each other, the handle 36 will not move along the second direction Y since the guiding fastener 3231 is not in contact with the first guiding wall 3814.

Two guiding slots 3237 are defined on the first base 329. The guiding slot 3237 extends in the second direction Y. The sliding part 362 extends into the guiding slot 3237, so that the handle 36 is guided along the second direction Y when moving with respect to the first base 329.

A notch 3210 is defined on the second plate 3214. When the second plate 3214 is connected to the second base 325, the notch 3210 forms a through hole. The slider 38 further includes a locking part 383. The locking part 383 is arranged at one end of the main part 381 away from the mounting part 385. In other words, the locking part 383 is arranged on a side of the main part 381 of the slider 38 away from the other slider 38. A plurality of locking holes 211 is defined on the rack 200. When the two sliders 38 are moving away from each other, the locking part 383 can pass through the through hole and extend into the locking hole 211. When the locking part 383 extends into the locking hole 211, an inner wall of the locking hole 211 acts on the locking part 383, to lock the locking assembly on the rack 200. Thereby, the storage module 100 is fixed with the rack 200 in the mounting cavity.

Figure 5A:
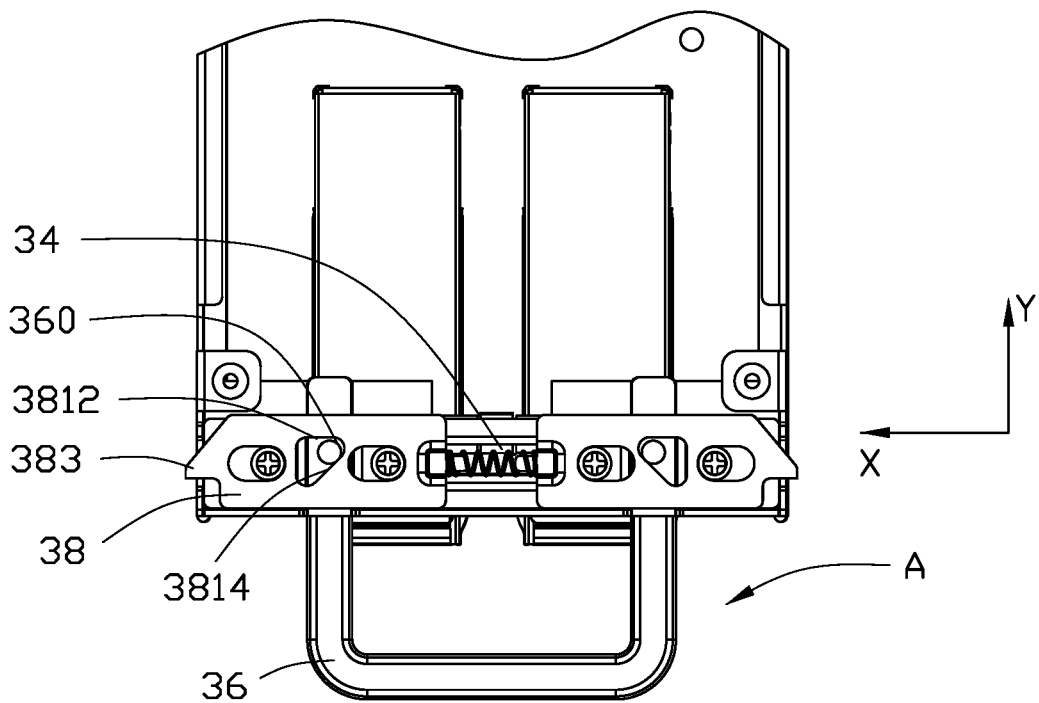
FIG. 5A is a vertical view of a storage module in position A according to an embodiment of the present disclosure.
Figure 5B:
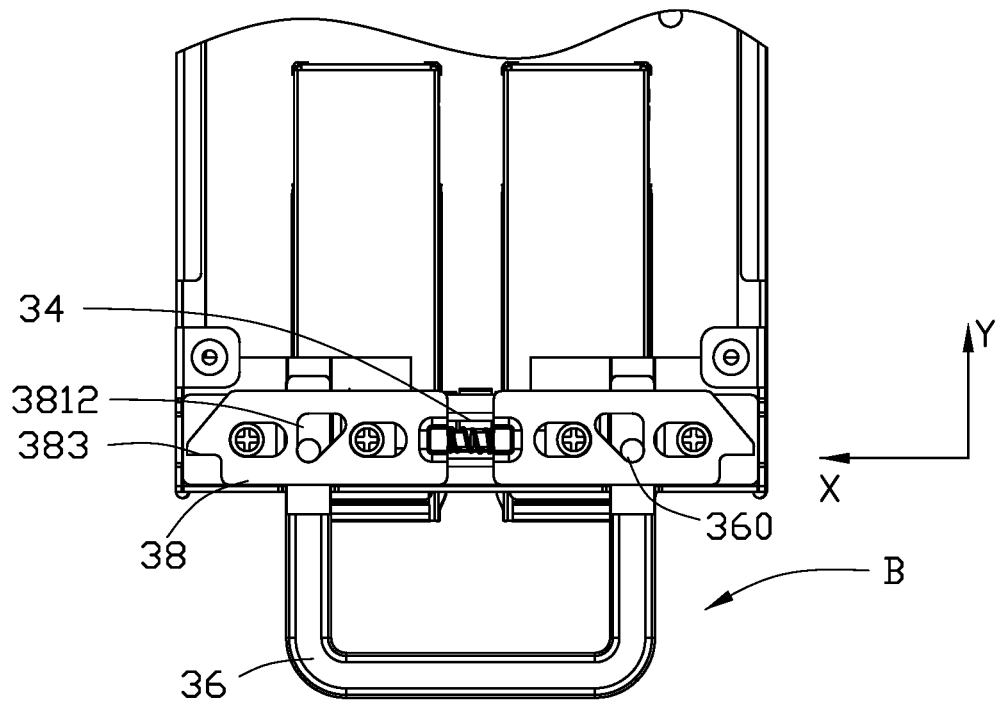
FIG. 5B is a vertical view of a storage module in position B according to an embodiment of the present disclosure.

As shown in FIG. 5A and FIG. 5B, the handle 36 can slide in the second direction Y between a first position A and a second position B. Since the bulge part 360 acts on the first guiding wall 3814, the slider 38 can slide relative to the first base 329. When the handle 36 in the first position A, the locking part 383 extends out of the frame 30. A distance between the two sliders 38 when the handle 36 in the first position A is greater than such distance in the second position B. The length of the elastic member 34 when the handle 36 is in the first position A is greater than that in the second position B.

In another embodiment, the through hole can be defined in the second plate 3214.

In another embodiment, the frame 30 does not include the second base 325, the locking part 383 can pass through the notch 3210, and extend into the locking hole 211.

When the storage module 100 is mounted in the mounting cavity, the handle 36 can be pulled in a second direction Y, so that the slider 38 is driven in a first direction X.

The locking part 383 is triangular, a third guiding wall 3831 and a fourth guiding wall 3835 are defined on the locking part 383. The third guiding wall 3831 is defined on the locking part 383 away from the moving part 361. The fourth guiding wall 3835 is arranged on the locking part 383 close to the first plate 3212. In other words, the fourth guiding wall 3835 is arranged on the locking part 383 close to the moving part 361. The fourth guiding wall 3835 is parallel to the first direction X. The third guiding wall 3831 is inclined between the first direction X and the second direction Y. When the locking part 383 passes through the through hole, and the storage module 100 is moved in the second direction Y with respect to the rack 200, the third guiding wall 3831 acts on the rack 200, and guides the locking part 383 to move in the first direction X. The fourth guiding wall 3835 acts on an inner wall of the notch 3210, and prevents the locking part 383 from moving forward to the first plate 3212.

In another embodiment, an electronic card can be mounted in the carrier tray, so that, when the carrier tray is mounted in the mounting cavity, the electronic card will be coupled to the mainboard.

For mounting the storage module 100 in the mounting cavity:

The storage module 100 is pushed into the mounting cavity parallel to the second direction Y. The third guiding wall 3831 acts on the inner wall of the mounting cavity, and the locking part 383 is forced to move parallel to the first direction X, away from the inner wall of the mounting cavity. The elastic member 34 is accordingly compressed, and stored energy of the elastic member 34 is increased. When the locking part 383 is aligned with the locking hole 211, the elastic member 34 releases the stored energy so that the locking part 383 is inserted into the locking hole 211. The fourth guiding wall 3835 acts on the inner wall of the locking hole 211 to prevent the storage module 100 dropping out of the mounting cavity in the first direction X.

To remove the storage module 100 from the mounting cavity:

The handle 36 is pulled away from the mounting cavity in the first direction X. Since the bulge part 360 acts on the first guiding wall 3814, the locking part 383, in the first direction X, leaves the locking hole 211. When the fourth guiding wall 3835 leaves the inner wall of the locking hole 211, the storage module 100 can be taken out of the mounting cavity in the first direction X.

The locking part 383 can be returned to the unity cavity from the locking hole 211 by pushing and sliding the handle 36 from the first position A to the second position B. Moving the handle 36 in the second direction Y removes the carrier tray from the assembling cavity 210. Therefore, there is no need to drive two unlocking members in the first direction X to allow removal of the carrier tray from the assembling cavity 210. Since the carrier tray is not provided with unlocking parts 383, the volume and profile of the carrier tray can be reduced in size.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims.

What is claimed is:

1. A carrier tray comprising: a frame comprising a bracket, and a unit cavity defined in the bracket; two sliders slidably coupled to the frame along a first direction; an elastic member mounted between the two sliders; and a handle slidably coupled to the frame along a second direction perpendicular to the first direction, and slidably coupled to the two sliders for driving the two sliders to move, the handle being configured to slide between a first position and a second position, wherein: when the handle is in the first position, each of the two sliders partially extends out of the unit cavity; a distance between the two sliders when the handle is in the first position is greater than a distance between the two sliders when the handle is at the second position; and a length of the elastic member when the handle is in the first position is greater than a length of the elastic when the handle is at the second position.

2. The carrier tray of claim 1, wherein:
a first guiding hole is defined on each of the two sliders, the first guiding hole extending in the first direction;
the frame further comprising a first base and a guiding fastener, wherein
the first base is coupled to the bracket;
the two sliders are slidably coupled on the first base; and
the guiding fastener is coupled to the first base, and extends through the first guiding hole.

3. The carrier tray of claim 2, wherein:
the guiding fastener comprising:
a guiding shank coupled to the first base, and configured to extend through the first guiding hole; and
a guiding head connected to the guiding shank, and arranged away from the first base to restrict the slider between the guiding head and the first base.

4. The carrier tray of claim 2, wherein:
a second guiding hole is defined on each of the two sliders, a first guiding wall is formed by an inner wall of the second guiding hole;
the handle comprises two bulge parts, each of the two bulge parts is configured to extend into the second guiding hole,
each of the two bulge part acts on the first guiding wall to drive the slider moving parallel to the first direction when the handle moves parallel to the second direction.

5. The carrier tray of claim 4, wherein:
the handle comprising:
a moving part not within the unit cavity;
two sliding parts coupled to both sides of the moving part, respectively, along the first direction;
two guiding slots defined in the frame, each of the two sliding parts is configured to extend into a respective one of the two guiding slots to guide each of the two sliding parts moving along the second direction;
the bulge part is arranged on each of the sliding part.

6. The carrier tray of claim 4, wherein:
a cross section of the second guiding hole is a triangular, the first guiding wall is inclined in the first direction and the second direction.

7. The carrier tray of claim 1, wherein:
each of the two sliders comprises:
a main part slidable coupled to the frame; and
a locking part arranged on a side of the main part of the slider away from the other slider, wherein
when the handle is in the first position, the locking part extends out of the unit cavity.

8. The carrier tray of claim 7, wherein:
each of the two sliders further comprises:
a mounting part arranged on a side of the main part of the slider close to the other slider, wherein
the elastic member is sleeved on the mounting part of one of the two sliders.

9. The carrier tray of claim 2, wherein:
the frame further comprises a second base;
a mounting cavity is formed between the first base and the second base, the two sliders is mounted in the mounting cavity; and
the second base is connected to the bracket.

10. The carrier tray of claim 9, wherein:
the bracket comprises a flange, a first hole is defined on the flange;
a second hole is defined on the second base;
the frame further comprises a mounting fastener, and the mounting fastener comprises:
a mounting shank configured to penetrate through the first hole and the second hole, and screw on the first base;
a mounting head connected to the guiding shank, and arranged away from the first base to couple the second base and the flange.

11. The carrier tray of claim 4, wherein:
a second guiding wall is formed by the inner wall of the second guiding hole, and the second guiding wall is parallel to the first direction;
when the two sliders are approaching each other, the guiding fastener is in contact with the second guiding wall to guide the two sliders to move parallel to the first direction.

12. The carrier tray of claim 7, wherein:
a third guiding wall is defined on the locking part away from the handle;

the third guiding wall is inclined in the first direction and the second direction.

13. The carrier tray of claim 7, wherein:
a fourth guiding wall is defined on the locking part;
the fourth guiding wall is arranged on the locking part close to the handle, and is parallel to the first direction.

14. The carrier tray of claim 10, wherein:
the bracket further comprises:
   a first plate;
   two second plates disposed on opposite sides of the first plate, respectively, along the first direction, respectively;
   the flange is coupled to the second plate.

15. The carrier tray of claim 14, wherein:
the bracket further comprises a third plate;
the third plate is arranged between the two second plates, and connected to the two second plates and the first plate.

16. The carrier tray of claim 14, wherein:
a notch is defined on the second plate close to the second base.

17. A storage module, comprising: a storage unit; a carrier tray comprising: a frame comprising a bracket, a unit cavity defined in the bracket, the storage unit being mounted in the unit cavity; two sliders slidably coupled to the frame along a first direction; an elastic member mounted between the two sliders; and a handle slidably coupled to the frame along a second direction perpendicular to the first direction, and slidably coupled to the two sliders to drive the two sliders to move, wherein the handle is configured to slide between a first position and a second position, when the handle in the first position, each of the two sliders partially extends out of the unit cavity; a distance between the two sliders when the handle is in the first position is greater than a distance between the two sliders when the handle is at the second position; and a length of the elastic member when the handle is in the first position is greater than a length of the elastic when the handle is at the second position.

18. The storage module of claim 17 further comprising an adapter, wherein:
the adapter is arranged in the unit cavity, and connected to the bracket;
the adapter is coupled to the storage unit;
a connection part is defined on the adapter to couple to a mainboard.

19. A computer, comprising: a rack, an assembling cavity defined in the rack, two locking holes defined on the rack; and a storage module comprising a storage unit and a carrier tray, wherein the carrier tray comprising: a frame comprising a bracket, a unit cavity defined in the bracket, the storage unit mounted in the unit cavity; two sliders slidably coupled to the frame along a first direction; an elastic member mounted between the two sliders; and a handle slidably coupled to the frame along a second direction perpendicular to the first direction, and slidably coupled to the two sliders to drive the two sliders to move; the handle configured to slide between a first position and a second position, wherein: when the handle in the first position and the frame extends into the assembling cavity, each of the two sliders partially extends into each of the two locking holes from the unity cavity; a distance between the two sliders when the handle is in the first position is greater than a distance between the two sliders when the handle is at the second position; and a length of the elastic member when the handle is in the first position is greater than a length of the elastic when the handle is at the second position.

\* \* \* \* \*